Dec. 11, 1956 G. E. THERIAULT 2,773,945

TRANSISTOR SIGNAL AMPLIFYING CIRCUITS

Filed Oct. 5, 1955 3 Sheets-Sheet 1

INVENTOR.
GERALD E. THERIAULT
BY [signature]
ATTORNEY

Dec. 11, 1956 G. E. THERIAULT 2,773,945
TRANSISTOR SIGNAL AMPLIFYING CIRCUITS
Filed Oct. 5, 1955 3 Sheets-Sheet 2

INVENTOR.
GERALD E. THERIAULT
BY H. L. Newton
ATTORNEY

Dec. 11, 1956 G. E. THERIAULT 2,773,945

TRANSISTOR SIGNAL AMPLIFYING CIRCUITS

Filed Oct. 5, 1955 3 Sheets-Sheet 3

INVENTOR.
GERALD E. THERIAULT
BY H. E. Newton
ATTORNEY

United States Patent Office 2,773,945

Patented Dec. 11, 1956

2,773,945

TRANSISTOR SIGNAL AMPLIFYING CIRCUITS

Gerald E. Theriault, Haddon Heights, N. J., assignor to Radio Corporation of America, a corporation of Delaware Application October 5, 1955, Serial No. 538,577

8 Claims. (Cl. 179—171)

This invention relates to signal amplifying circuits for radio signal receiving systems and the like, and in particular to signal amplifying circuits of the type employing semi-conductor devices such as transistors as active signal amplifying devices.

Signal receivers are generally provided with an automatic gain control (AGC) system for maintaining the amplitude of the intermediate frequency signal which is applied to the second detector substantially constant over a relatively wide range of variation in the amplitude of the received signal. In developing radio signal receiving systems employing transistors, the advantages of incorporating an AGC system in the receiver were suggested from past experiences with electron tube receivers. Automatic gain control for such systems has been accomplished in a number of ways. As an example, a signal responsive voltage or current has been applied to the emitter or base electrodes of one or more transistor amplifiers to control their gain inversely with signal strength. One of the problems introduced by the application of this type AGC is that the transistors' input resistance varies as their gain is controlled in the desired manner. These input resistance variations may vary the loading on the coupling circuits of the amplifier and hence the frequency response of the amplifier, producing undesired distortion. This is particularly critical in the signal amplifying circuits of television signal receiving systems where a rather wide band of frequencies must be accommodated. Ideally, the frequency response of such amplifying circuits should be flat over this frequency band.

Accordingly, it is a principal object of the present invention to provide improved tuned, variable-gain transistor signal amplifying circuits for radio signal receivers and the like wherein a substantially flat response is achieved over the frequency band at which the amplifying circuits operate with variations in the input resistance of the transistors.

It is another object of the present invention to provide improved transistor signal amplifying circuits of the type referred to wherein variations in the frequency response of the amplifying circuits due to the application of automatic gain control potentials or currents to the transistors are substantially eliminated.

It is a further object of the present invention to provide means in tuned signal amplifying circuits of the type employing transistors as active signal amplifying elements wherein a substantially flat frequency response and distortion-free circuit operation are achieved with changes in loading due to the application of an AGC signal to the transistors.

The above and other objects and advantages of the present invention may be achieved more readily in signal receivers wherein the AGC supply means or source is coupled to the emitter or base electrodes of the controlled transistor amplifier circuits and cause the gain of these circuits to be reduced as the signal strength is increased. Under normal circumstances this type of AGC system would vary the input resistance of the transistors and, therefore, the loading and the frequency response of the signal amplifying circuits. To provide a flat frequency response for such a circuit, in accordance with the invention, single tuned coupling circuits are provided between predetermined transistor amplifier stages and the remaining coupling circuits between the amplifier stages are of the double tuned type. Full realization of the advantages of the AGC action are thus obtained without adversely affecting the frequency response of the circuit.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 2:
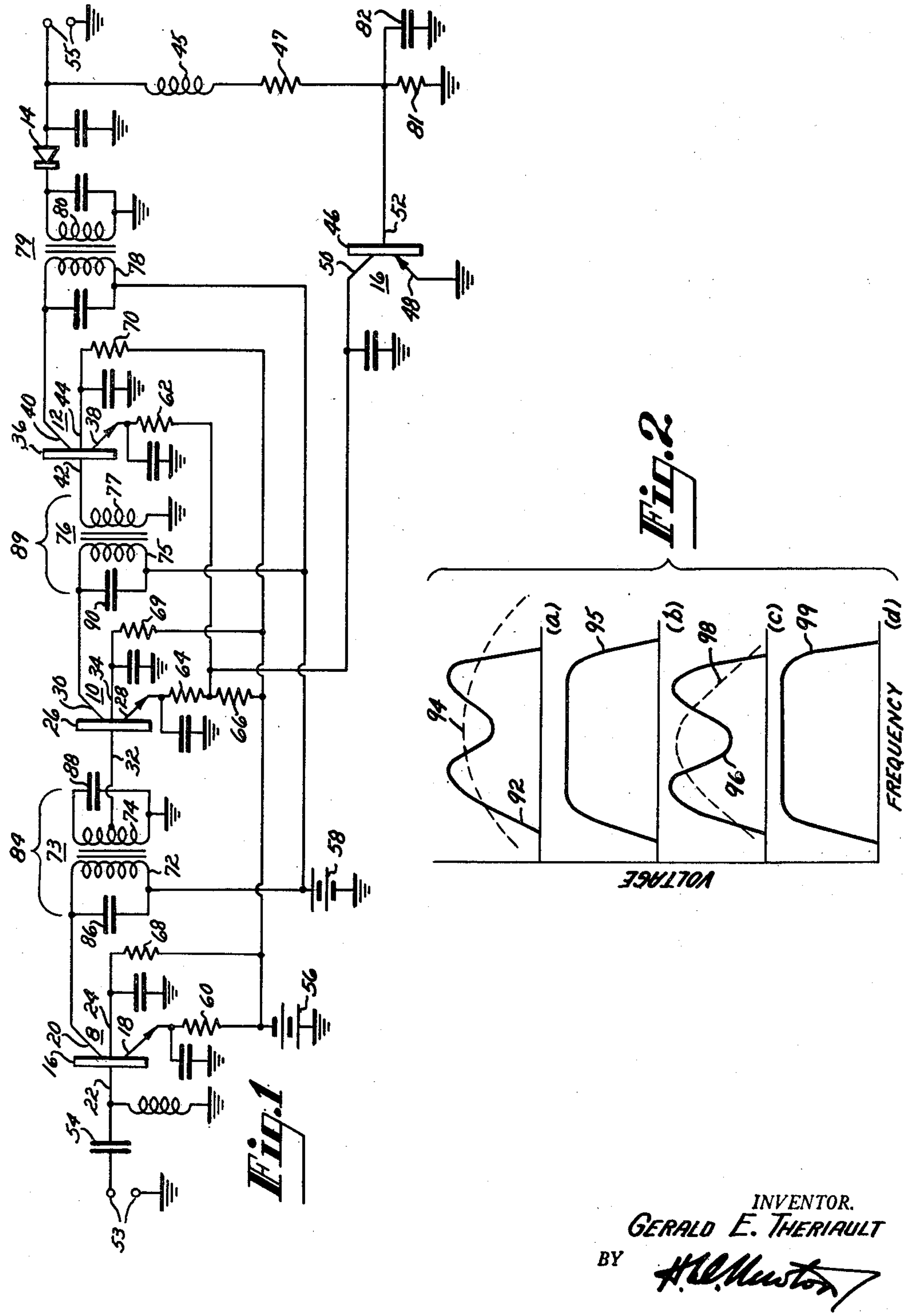
Figure 1 is a schematic circuit diagram of a transistor signal amplifier circuit and AGC system for signal receiving systems and the like illustrating one embodiment of the present invention.
Figure 2 is a series of graphs showing curves relating output voltage versus frequency for the transistor amplifier circuit of Figure 1.

Referring now to the drawing, wherein like parts are indicated by like reference numerals throughout the figures, and referring particularly to Figure 1, a 3-stage signal amplifier circuit such as, for example, the intermediate frequency amplifying stage of a radio signal receiving system, a television receiving system being an example, includes three transistor amplifiers 8, 10, and 12, a diode detector 14, and a transistor AGC amplifier 16. Each of the transistor amplifiers 8, 10, and 12 may be considered to be junction transistors of the tetrode type and have been illustrated by way of example as being of P type conductivity. It should be understood that the invention is in no way limited to transistors of either the junction or tetrode type or of any other specific conductivity type. Each of the transistors 8, 10, and 12 includes four electrodes which are cooperatively associated with a semi-conductive body in a well known manner. Thus the transistor 8 includes a semi-conductive body 16 and an emitter 18, a collector 20, a normal base electrode 22, and an auxiliary base electrode 24. The transistor 10 includes a semi-conductive body 26 and an emitter 28, a collector 30, a normal base electrode 32, and an auxiliary base electrode 34. In the same manner, the transistor 12 includes a semi-conductive body 36 and an emitter 38, a collector 40, a normal base electrode 42, and an auxiliary base electrode 44. The normal base electrodes may be considered to be input electrodes, the collectors as output electrodes, and the emitters as common electrodes for each of these transistors. The AGC amplifier transistor 16 is of the 3-electrode junction type and may be considered to be a P-N-P junction transistor. In other words, the transistor 16 is of an opposite conductivity type to the tetrode transistor amplifiers. It includes a semi-conductive body 46 with which an emitter 48, a collector 50, and a base electrode 52 are cooperatively associated in a well known manner. The anode of the diode detector 14 is connected through a radio frequency choke coil 45 and a resistor 47 to the base 52 of the transistor 16. In general, the diode 14 will be poled for easy current flow in the same direction as that of easy current flow through the emitter and base electrodes of the transistor AGC amplifier. Input signals are applied to the amplifier circuit through a pair of input terminals 53, one of which is grounded and the other of which is connected through a coupling capacitor 54 to the base 22 of the first transistor amplifier 8. Detected output signals may be taken from a pair of output terminals 55, one of which is grounded and the other of which is connected with the anode of the diode detector 14.

To provide biasing potentials for the transistor amplifiers 8, 10, and 12 and the AGC amplifier transistor 16, a pair of batteries 56 and 58 are provided. The positive terminal of the battery 56 is grounded while its negative terminal is connected through a stabilizing resistor 60 to the emitter 18 of the transistor 8 and through a pair of stabilizing resistors 66 and 64 to the emitter of the second transistor amplifier 10. The negative terminal of the battery 56 is also connected through the resistor 66 and a stabilizing resistor 62 to the emitter 38 of the third transistor amplifier 12 and through the resistor 66 to the collector 50 of the AGC amplifier transistor 16. The resistor 66 in the emitter circuit of the second and third transistor amplifier stages serves as a load for the AGC amplifier transistor 16. The negative terminal of the battery 56 is also connected through respective resistors 68, 69, and 70 to the auxiliary base electrodes 24, 34, and 44 of the transistor amplifiers 8, 10, and 12. Each of the emitter stabilizing resistors and the resistors in the auxiliary base electrode circuits of the transistors 8, 10, and 12 is by-passed by a capacitor as shown. The biasing battery 58 is used to provide collector biasing potentials for the three tetrode transistor amplifiers 8, 10, and 12. To this end, the negative terminal of the battery 58 is grounded and its positive terminal is connected through the primary windings 72, 75, and 78 of interstage coupling transformers 73, 76, and 79 respectively to the collectors 20, 30, and 40 of the transistors 8, 10, and 12 respectively.

Automatic gain control of the amplifier circuit illustrated in Figure 1 is accomplished, by way of example, by connecting the collector 50 of the AGC amplifier transistor 16 to the emitters 28 and 38 of the second and third tetrode transistors 10 and 12, respectively, through the emitter stabilizing resistors 64 and 62. As was described hereinbefore, the anode of the diode detector 14 is connected to the base 52 of the AGC transistor amplifier 16 through the radio frequency choke coil 45 and the resistor 47. The lower end of the resistor 47 is connected through a resistor 81 to ground and the junction of these resistors is connected to the base 52 of the transistor AGC amplifier 16, thus providing a voltage dividing network. The resistor 81 is by-passed by a capacitor 82.

In operation, an increase in the amplitude of the applied signal will make the base 52 of the AGC transistor amplifier 16 more negative which will increase its collector current. Any increase in the collector current of the transistor AGC amplifier 16 will cause the emitter current of the transistors 10 and 12 to decrease. This decrease in the emitter current of these transistors will decrease their gain which has the effect of maintaining the amplitude of the developed output signal substantially constant. By so controlling the emitter current of the transistor, however, the input resistance of the transistor which is so controlled is also varied. Thus, a reduction in emitter current produces an increase in input resistance. These variations in the input resistance will tend to load the interstage coupling circuits of the amplifier, providing a frequency response which is not flat, resulting in undesired distortion of the available output signal.

To provide a flat frequency response for an amplifier circuit, the gain of which is controlled by the application of an AGC signal to one or more of the amplifier stages, in accordance with the invention, one or more of the stages to which the AGC signal is applied is coupled to a preceding stage by means of a single tuned coupling circuit. In the event that the AGC signal is applied to two of such amplifier stages, the remaining stage will be coupled to a preceding stage by means of a double-tuned circuit. If the AGC signal is applied to more than two amplifier stages, the number of single-tuned coupling circuits will be chosen to be equal to the number of double-tuned circuits. In the circuit of Figure 1, for example, the AGC signal is applied to the second transistor amplifier 10 and the third transistor amplifier 12. Accordingly, the first transistor amplifier 8 is coupled to the second transistor amplifier 10 by means of a double-tuned circuit 84 which includes the transformer 73 and which may be considered to be an overcoupled band-pass filter. The primary winding 72 of the transformer 73 is shunted by a capacitor 86 to form one tuned circuit, and the secondary winding 73 is also shunted by a capacitor 88 to form the second tuned circuit. The upper end of the first tuned circuit, comprising the inductive winding 72 and the capacitor 86, is connected with the collector 20 of the first transistor amplifier 8. A tap on the inductor 74 of the second tuned circuit is connected directly with the base 32 of the second transistor amplifier 10.

The coupling circuit between the second and third transistor amplifiers 10 and 12, respectively, comprises a single-tuned circuit 89 in accordance with the invention. Accordingly, the primary winding 75 of the coupling transformer 76 is shunted by a capacitor 90 to provide a tuned circuit, while the secondary winding 77 of the transformer 76 is connected directly with the base 42 of the third transistor amplifier 12. The upper end of the tuned circuit comprising the inductive winding 75 and the capacitor 90 is connected directly with the collector 30 of the second transistor amplifier 10. The collector 40 of the third transistor amplifier 12 is coupled through a double-tuned circuit which includes the transformer 79, having primary and secondary windings 78 and 80, respectively, to the cathode of the diode detector 14.

For an example of the manner in which a circuit embodying the invention provides a flat frequency response despite variations in loading caused by the application of an AGC signal to the transistors, reference is made to Figure 2. In Figure 2*a*, two voltage vs. frequency curves 92 and 94 are illustrated for a circuit of the general type illustrated in Figure 1. The curve 92 represents the frequency response of a double-tuned circuit of the type indicated by the reference numerals 84 in Figure 1 for the application of an AGC signal of predetermined magnitude to the transistor 10. The curve 94 illustrates, on the other hand, the frequency response of a single-tuned circuit of the type illustrated by the reference numeral 89 in Figure 1 for the application of an AGC signal of predetermined magnitude to the transistor 12. The overall frequency response in the output circuit of the third amplifier 12 is illustrated by the curve 95 in Figure 2*b* and is flat as shown. Next, assume that the load on the tuned circuits 84 and 89 is varied, as by varying the AGC signal which is applied to the emitters 28 and 38 of the transistors 10 and 12 respectively, thus varying the input resistance of these transistors. As an example, assume that the loading is decreased. This will cause the valley in the frequency response of the over-coupled double-tuned circuit 84 to decrease as shown by the curve 96 in Figure 2*c* while the response for the single-tuned circuit 89 becomes more narrow and peaked as shown by the curve 98, also in Figure 2*c*. Accordingly, by provision of the invention, the overall frequency response of an amplifier circuit is flat as shown by the curve 99 in Figure 2*d*.

Figure 3:
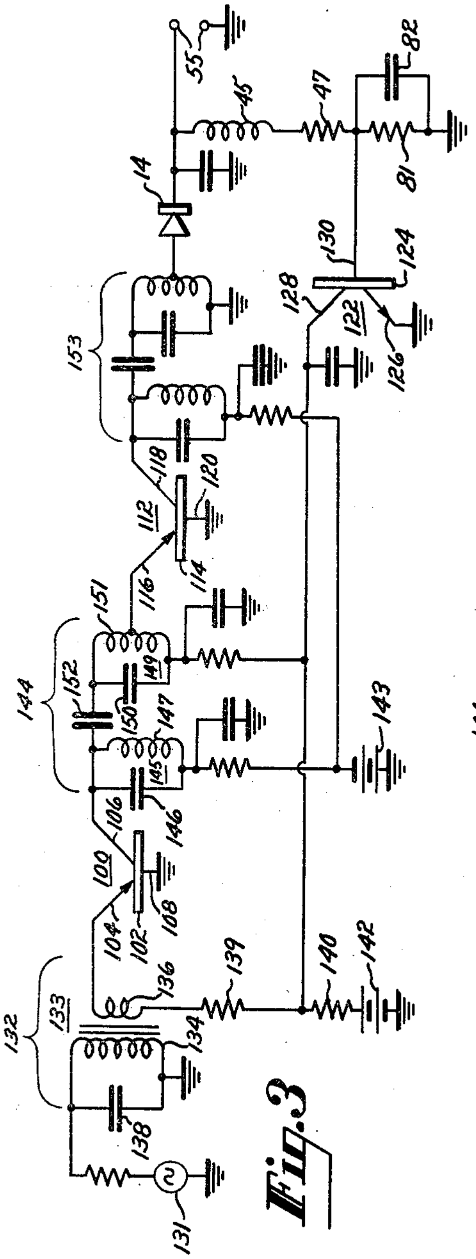
Figures 3, 4, and 5 are schematic circuit diagrams of transistor signal amplifier circuits and AGC systems illustrating further embodiments of the present invention.

As was mentioned hereinbefore, the present invention is not restricted to transistors of any specific type or configuration, nor is it restricted to any particular type of automatic gain control system. Thus in Figure 3 the invention has been applied to a two-stage amplifier which includes a pair of 3-electrode transistors 100 and 112 which may be considered to be of the P-N-P junction type. The amplifier circuit illustrated in Figure 3 also includes a diode detector 14 and an AGC transistor amplifier 122 which may be considered to be a junction transistor of the N-P-N type. The transistor 100 includes a semi-conductive body 102 with which an emitter 104, a collector 106, and a base electrode 108 are cooperatively associated in a well known manner. The transistor 112 also includes a semi-conductive body 114 and three electrodes, namely an emitter 116, a collector 118, and a base 120. The AGC transistor amplifier 122, which is of an opposite conductivity type to the transistors 100 and 112, includes a semi-conductive body 124 and an emitter 126, a collector 128, and a base 130. Input signals from an alternating current source 131, one terminal of which is grounded, are applied to the emitter 104 of the transistor 100, in accordance with the invention, through a single-tuned coupling circuit 132 which includes a transformer 133 having a primary winding 134 and a secondary winding 136. The primary winding 134 is shunted by a capacitor 138 to form a tuned circuit, while the upper end of the secondary winding 136 is connected directly to the emitter 104 of the first transistor amplifier 100. The emitter 104 of this transistor thereby serves as the input electrode, while the base 108, which is connected directly to ground as shown, serves as the common electrode. The lower end of the secondary winding 136 is connected through a pair of resistors 130 and 140 to the positive terminal of a biasing battery 142, the negative terminal of which is grounded. The resistor 140 serves as the load for the AGC transistor amplifier 122, which is connected so as to vary the emitter current of each of the transistor amplifiers 100 and 112 to vary their gain with variations in the amplitude of an applied signal. The battery 142 is connected to provide emitter biasing voltages for the transistors 110 and 112 and collector biasing potentials for the AGC transistor amplifier 122. A second biasing battery 143 is also provided, the positive terminal of which is grounded and the negative terminal of which is connected to supply collector biasing potentials for the transistor amplifiers 100 and 112.

The collector electrode 106 which serves as the output electrode for the first transistor amplifier 100 is coupled through a double-tuned coupling circuit 144, which includes a first tuned circuit 145, comprising a capacitor 145 and an inductor 147 connected in parallel, and a second tuned circuit 149 which comprises a capacitor 150 connected in shunt with an inductor 151, to the emitter 116 of the second transistor amplifier 112. A tap on the inductor 151 is connected directly with the emitter 116 of the second transistor 112. The upper end of each of the tuned circuits 145 and 149 are capacitively coupled by means of a capacitor 152. The base 120 of the transistor amplifier 112 is common to the input and output circuits of this transistor and is connected to ground as shown, while the collector 118 of the transistor 112 is coupled through a double-tuned coupling circuit 153 to the anode of the diode detector. The collector 118 thus serves as the output electrode for the transistor 112.

In operation, an increase in signal strength will increase the collector current of the transistor AGC amplifier 122, which will in turn decrease the emitter current of the transistor amplifiers 100 and 112 to decrease their gain. This will vary the loading on the coupling circuits 132 and 144 as was described in connection with Figure 1. In accordance with the invention, however, and in a manner disclosed in connection with Figures 1 and 2, the use of a single-tuned coupling circuit in conjunction with a double-tuned coupling circuit provides a flat frequency response for the amplifier circuit despite these variations in loading.

Figure 4:
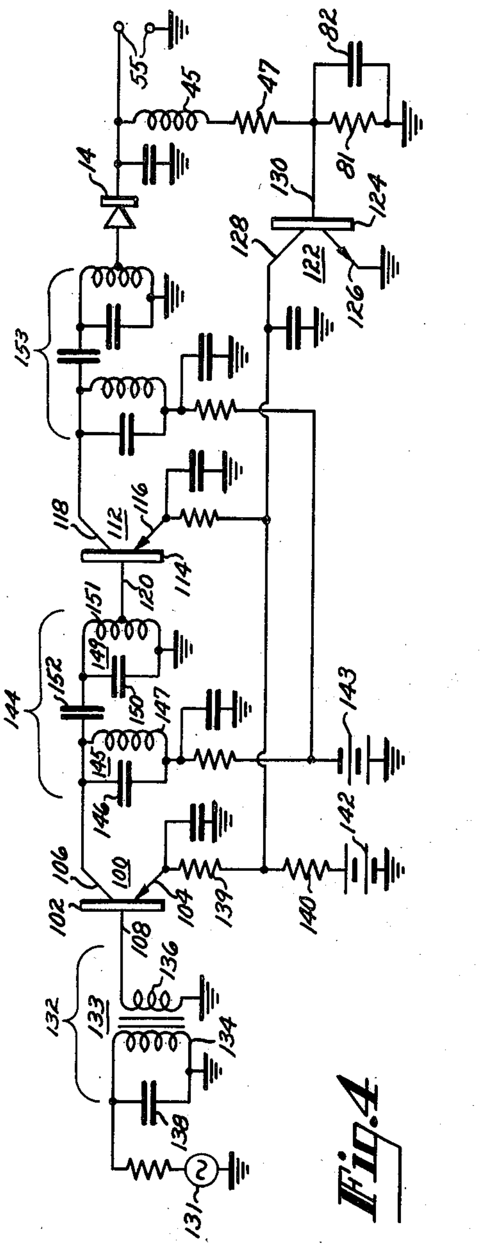

In Figure 4, a two-stage amplifier includes a pair of transistors 100 and 112 which in this instance are connected in the so-called common emitter configuration. Accordingly, the respective base electrodes 108 and 120 of the transistors 100 and 112 are input electrodes, while the collectors 106 and 118 of these transistors serve as output electrodes. The AGC signal from the detector 14, which is amplified by the AGC amplifier 122, is applied to the emitter electrodes of the transistor 104 and 116 to control their gain. In other respects the circuit illustrated in Figure 4 is substantially identical to the one illustrated in Figure 3, and includes the single-tuned coupling circuit 132 and the double-tuned coupling circuit 144. Moreover, this circuit operates to provide, in accordance with the invention, a flat frequency response in the same manner as disclosed hereinbefore.

Figure 5:
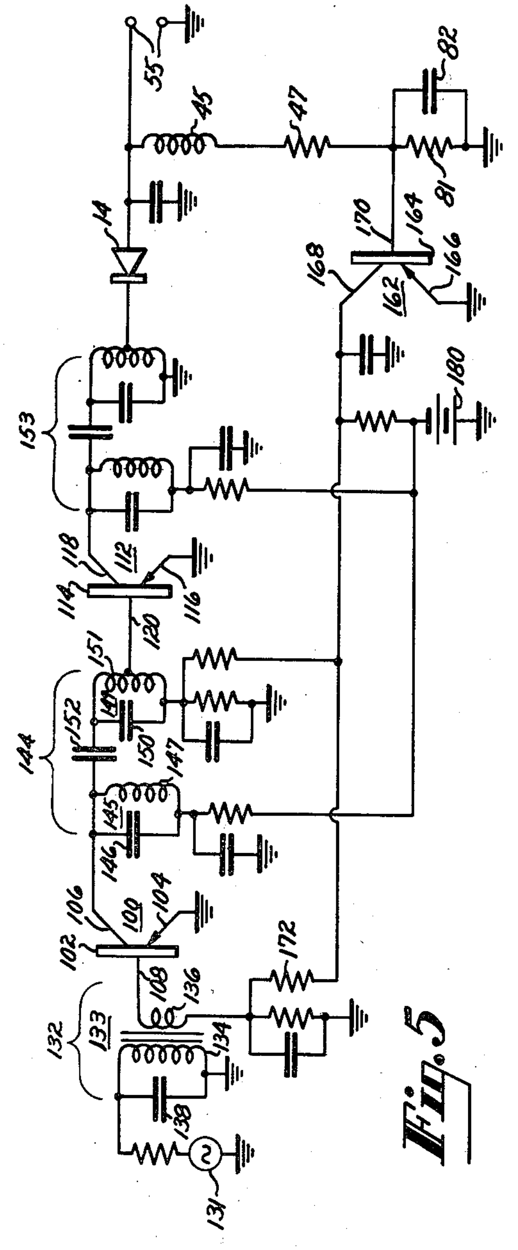

Referring now to Figure 5, a two-stage amplifier includes the transistors 100 and 112 which in this embodiment of the invention are also connected in the common emitter configuration. In this embodiment of the invention, however, the AGC signal is applied to the base electrodes 108 and 120 of these transistors to control the gain of each of them. To this end, the anode of the diode detector 114 is coupled to the base 170 of an AGC amplifier transistor 162 which may be considered to be a junction transistor of the P-N-P type, that is, of the same conductivity type as the transistors 100 and 112. The transistor 162 includes a semi-conductive body 164 with which an emitter 166, a collector 168, and a base 170 are cooperatively associated. The emitter 166 of the transistor AGC amplifier 162 is grounded, while its collector 168 is connected through a first resistor 172 and the secondary winding 176 to the base 108 of the transistor 100, and through a second resistor 174 and the lower half of the tapped inductor 151 to the base 120 of the transistor amplifier 112. Thus, the AGC amplifier 162, in this embodiment of the invention, is operative to apply an AGC signal to the respective base electrodes of the transistor amplifiers 100 and 122 to control the gain thereof. Since the transistor amplifiers 100 and 122 and the transistor AGC amplifier 162 are of the same conductivity type, only one biasing battery 180 is required which is connected to apply collector biasing potentials to each of these transistors. The circuit illustrated in Figure 5 is in other respects substantially similar to the circuit illustrated in Figure 4. Thus, the input signal from a source 131 is coupled through a single-tuned coupling circuit 132 to the base 108 of the first transistor amplifier 100 and the output signal appearing on the collector 106 of this transistor is coupled through a double-tuned coupling circuit 144 to the base 120 of the second transistor amplifier 112. In this manner, by using a single-tuned and a double-tuned circuit, a substantially flat frequency response is provided despite changes in the input resistance of the transistors 100 and 112, due to variations in their gain caused by the application of an AGC signal to their respective base electrodes.

In operation, an increase in the amplitude of an applied alternating current signal will cause the base of the transistor AGC amplifier 162 to become more negative which will increase the flow of current in this transistor's collector 168. This will, in turn, cause the base electrodes 108 and 120 of the transistor amplifiers 100 and 122 to become more positive thereby reducing the gain of these transistors. These changes in the gain of the transistors 100 and 112 will be accompanied, as was explained hereinbefore, by a change in their input resistance. Since, however, the amplifier stages are intercoupled as described and in accordance with the teachings of the present invention, the variations in input resistance will be compensated for and a substantially flat frequency response will be achieved.

As described herein, transistor signal amplifying circuits embodying the invention provide a flat frequency response despite changes in their loading due to the aplication of an AGC signal. Thus, the circuits embodying the invention may be useful wherever distortion-free circuit operation is required with effective automatic gain control of the system, the amplifying circuits of a television signal receiving system being one example.

What is claimed is:

1. A signal amplifier comprising, in combination, a plurality of signal amplifying stages each including a transistor having at least an input, an output, and a common electrode, automatic gain control means coupled with at least two of said transistors for varying the signal gain therethrough in response to variations in the amplitude of an applied signal, first coupling means for applying signals to the input electrode of one of said two transistors including a single tuned coupling circuit responsive to signals in a predetermined frequency band, and second coupling means for applying signals to the input electrode of the other of said two transistors including a double tuned coupling circuit responsive to signals in said predetermined frequency band, said first and second coupling means being effective in the signal translating path of the amplifier for providing a substantially flat overall frequency response with variations in the signal gain through said two transistors in response to operation of said automatic gain control means.

2. In a signal amplifier for radio signal receivers and the like, the combination with a plurality of signal amplifying stages connected in cascade and including a first transistor signal amplifying device having at least an input, an output, and a common electrode and a second transistor signal amplifying device having at least an input, an output, and a common electrode, of means providing a source of automatic gain control signal for said circuit, means coupling said automatic gain control source to one of said input and common electrodes of said first transistor signal amplifying device to control the gain therethrough in response to variations in the amplitude of an applied alternating current signal, means coupling said automatic gain control source to one of said input and common electrodes of said second transistor signal amplifying device to control the gain therethrough in response to said variations in the amplitude of an applied alternating current signal, first signal coupling means for applying an alternating current signal between the input and common electrodes of said first transistor signal amplifying device including a single tuned coupling circuit responsive to signals in a predetermined frequency band, second signal coupling means for applying an alternating current signal between the input and common electrodes of said second transistor signal amplifying device including a double tuned coupling circuit responsive to signals in said predetermined frequency band, and means providing an output circuit for said amplifier for deriving therefrom an alternating current output signal having a substantially flat frequency response.

3. In a signal receiving system, the combination with a plurality of transistor signal amplifying devices connected in cascade each including a base, an emitter, and a collector electrode, and signal detection means connected in said system to provide an automatic gain control signal which is variable in response to variations in the amplitude of a received signal, of means connecting said signal detection means with a first and a second of said transistors to vary the gain thereof with variations in said automatic gain control signal, a first input circuit means including a single tuned coupling circuit responsive to signals in a predetermined frequency band for applying an alternating current signal between the emitter and base electrodes of said first transistor, and a second input circuit means including a double tuned coupling circuit responsive to signals in said predetermined frequency band for applying an alternating current signal between the emitter and base electrodes of said second transistor, said first and second input circuit means being thereby effective in the signal translating path of said receiver for providing a substantially flat overall frequency response for said receiver with variations in the input resistance of said transistors.

4. A signal amplifier comprising, in combination, a plurality of signal amplifying stages each including a transistor having at least a base, a collector, and an emitter electrode, automatic gain control supply means coupled with the emitter electrodes of at least two of said transistors for varying the signal gain therethrough a response to variations in the amplitude of an applied signal, first coupling means for coupling a signal to the base electrode of one of said two transistors and including a single tuned coupling circuit responsive to signals in a predetermined frequency band, second coupling means for coupling a signal to the base electrode of the other of said two transistors and including a double tuned coupling circuit responsive to signals in said predetermined frequency band, said first and second coupling means being effective in the signal translating path of the amplifier for providing a substantially flat overall frequency response for said amplifier.

5. In a signal amplifier for radio signal receivers and the like, the combination with a plurality of signal amplifying stages connected in cascade and including a first transistor signal amplifying device having at least a base, an emitter, and a collector electrode, and a second transistor signal amplifying device having at least a base, an emitter, and a collector electrode, of means providing a source of automatic gain control signal for said circuit, means coupling said automatic gain control source to said base electrode of said first transistor signal amplifying device to control the gain thereof in response to variations in the amplitude of an applied alternating current signal, means coupling said automatic gain control source to said base electrode of said second transistor signal amplifying device to control the gain thereof in response to said variations in the amplitude of an applied alternating current signal, a first signal coupling means for applying an alternating current signal between the base and emitter electrodes of said first transistor signal amplifying device including a single tuned coupling circuit responsive to signals in a predetermined frequency band, a second signal coupling means for applying an alternating current signal between the base and emitter electrodes of said second transistor signal amplifying device including a double tuned coupling circuit responsive to signals in said predetermined frequency band, and means providing an output circuit coupled with the collector electrode of said second transistor for deriving therefrom an alternating current output signal having a substantially flat frequency response.

6. In a signal amplifier for radio signal receivers and the like, the combination with a plurality of signal amplifying stages connected in cascade and including a first transistor signal amplifying device having at least a base, an emitter, and a collector electrode, and a second transistor signal amplifying device having at least a base, an emitter, and a collector electrode, of means providing a source of automatic gain control signal for said circuit, means coupling said automatic gain control source to the emitter electrode of said first transistor signal amplifying device to control the gain thereof in response to variations in the amplitude of an applied alternating current signal, means coupling said automatic gain control source to the emittter electrode of said second transistor signal amplifying device to control the gain thereof in response to said variations in the amplitude of an applied alternating current signal, a first signal coupling means for applying an alternating current signal between the emitter and base electrodes of said first transistor signal amplifying device including a single tuned coupling circuit responsive to signals in a predetermined frequency band, a second signal coupling means for applying an alternating current signal between the emitter and base electrodes of said second transistor signal amplifying device including a double tuned coupling circuit responsive to signals in said predetermined frequency band, and means providing an output circuit coupled with the collector of said second transistor for deriving therefrom an alternating current output signal having a substantially flat frequency response.

7. An amplifier circuit for signal receiving systems, comprising, in combination, a plurality of signal amplifying stages each including a transistor having at least an emitter, a base, and a collector electrode, automatic gain control means coupled with the emitter electrodes of at least two of said transistors for varying the signal gain therethrough in response to variations in the amplitude of an applied signal, first coupling means for applying a signal to the base electrode of one of said two transistors and including a single tuned coupling circuit responsive to signals in a predetermined frequency band, a second coupling means for coupling a signal to the base electrode of the other of said two transistors and including a double tuned coupling circuit responsive to signals in said predetermined frequency band, said first and second coupling means being effective in the signal translating path of the amplifier for providing a substantially flat frequency response with variations in the signal gain through said two transistors in response to operation of said automatic gain control means.

8. In a signal amplifier the combination with a first transistor including a first base, a first emitter, and a first collector electrode; a second transistor including a second base, a second emitter, and a second collector electrode; and means for applying an automatic gain control signal to said first and second transistors for controlling the signal gain therethrough in response to variations in the amplitude of a received signal; of signal conveying coupling means for applying an alternating current signal effectively between said first base and first emitter electrodes and for providing a signal coupling path between said first collector electrode and said second base and second emitter electrodes and including a single tuned coupling circuit and a double tuned coupling circuit each responsive to signals in a predetermined frequency band and effective to provide a substantially flat frequency response for said amplifier with variations in the gain of said transistors.

No references cited.